(12) United States Patent
Perner et al.

(10) Patent No.: US 9,589,623 B2
(45) Date of Patent: *Mar. 7, 2017

(54) WORD SHIFT STATIC RANDOM ACCESS MEMORY (WS-SRAM)

(75) Inventors: Frederick A. Perner, Santa Barbara, CA (US); Matthew D. Pickett, San Francisco, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 194 days.

This patent is subject to a terminal disclaimer.

(21) Appl. No.: 14/374,776

(22) PCT Filed: Jan. 30, 2012

(86) PCT No.: PCT/US2012/023200
§ 371 (c)(1),
(2), (4) Date: Jul. 25, 2014

(87) PCT Pub. No.: WO2013/115779
PCT Pub. Date: Aug. 8, 2013

(65) Prior Publication Data
US 2014/0359209 A1    Dec. 4, 2014

(51) Int. Cl.
*G11C 11/406* (2006.01)
*G11C 11/407* (2006.01)
(Continued)

(52) U.S. Cl.
CPC ...... *G11C 11/40615* (2013.01); *G11C 11/407* (2013.01); *G11C 19/28* (2013.01); *G11C 11/412* (2013.01)

(58) Field of Classification Search
None
See application file for complete search history.

(56) References Cited

U.S. PATENT DOCUMENTS 3,593,310 A    7/1971   Kievit
3,670,313 A    6/1972   Beausoleil et al.
(Continued)

FOREIGN PATENT DOCUMENTS

CN    1762027 A    4/2006
CN    101162471 A    4/2008
(Continued)

OTHER PUBLICATIONS

PCT Search Report/Written Opinion—Application No. PCT/US2012/023200 dated Jan. 17, 2013—10 pages.
(Continued)

*Primary Examiner* — Ryan Bertram
*Assistant Examiner* — Jason Blust
(74) *Attorney, Agent, or Firm* — North Shore Associates

(57) ABSTRACT

Word shift static random access memory (WS-SRAM) cell, word shift static random access memory (WS-SRAM) and method using the same employ dynamic storage mode switching to shift data. The WS-SRAM cell includes a static random access memory (SRAM) cell having a pair of cross-coupled elements to store data, a dynamic/static (D/S) mode selector to selectably switch the WS-SRAM cell between the dynamic storage mode and a static storage mode, and a column selector to selectably determine whether or not the WS-SRAM cell accepts shifted data. The WS-SRAM includes a plurality of WS-SRAM cells arranged in an array and a controller to shift data. The method includes switching a storage mode and activating a column selector of, coupling data from an adjacent memory cell to, and storing the coupled data in, a selected WS-SRAM cell.

13 Claims, 5 Drawing Sheets

(51) Int. Cl.
*G11C 19/28* (2006.01)
*G11C 11/412* (2006.01)

(56) References Cited

U.S. PATENT DOCUMENTS

| | | | |
|---|---|---|---|
| 3,708,690 A | 1/1973 | Paivinen | |
| 3,760,382 A | 9/1973 | Itoh | |
| 3,766,534 A * | 10/1973 | Beausoleil | G11C 19/287 711/109 |
| 3,797,002 A | 3/1974 | Brown | |
| 3,812,336 A | 5/1974 | Bossen et al. | |
| 3,838,396 A | 9/1974 | Martin | |
| 3,893,088 A | 7/1975 | Bell | |
| 3,916,388 A | 10/1975 | Shimp | |
| 4,037,205 A | 7/1977 | Edelberg et al. | |
| 4,133,043 A | 1/1979 | Hiroshima et al. | |
| 4,322,365 A | 3/1982 | Merger | |
| 4,322,635 A | 3/1982 | Redwine | |
| 4,504,925 A | 3/1985 | Gilhousen | |
| 4,521,874 A | 6/1985 | Rau et al. | |
| 4,532,606 A | 7/1985 | Phelps | |
| 4,813,015 A * | 3/1989 | Spak | G11C 19/00 365/240 |
| 4,845,670 A | 7/1989 | Nishimoto et al. | |
| 4,864,454 A | 9/1989 | Wolfe | |
| 4,864,544 A | 9/1989 | Spak et al. | |
| 4,903,240 A | 2/1990 | Von Flue | |
| 5,050,067 A | 9/1991 | McLagan | |
| 5,153,846 A | 10/1992 | Rao | |
| 5,299,156 A | 3/1994 | Jaing et al. | |
| 5,313,433 A | 5/1994 | Waller | |
| 5,504,919 A | 4/1996 | Lee et al. | |
| 5,543,748 A | 8/1996 | Ando | |
| 5,612,964 A | 3/1997 | Haraszti | |
| 5,631,863 A * | 5/1997 | Fechner | G11C 11/4125 365/190 |
| 5,677,864 A | 10/1997 | Chung | |
| 5,698,997 A | 12/1997 | Williamson et al. | |
| 5,860,104 A | 1/1999 | Witt et al. | |
| 5,930,323 A | 7/1999 | Tang et al. | |
| 6,021,075 A | 2/2000 | Ueno | |
| 6,061,417 A | 5/2000 | Kelem | |
| 6,166,748 A | 12/2000 | Van Hook | |
| 6,222,757 B1 | 4/2001 | Rau et al. | |
| 6,239,638 B1 | 5/2001 | Masuda | |
| 6,327,175 B1 | 12/2001 | Manapat et al. | |
| 6,362,660 B1 | 3/2002 | Deng | |
| 6,411,230 B1 | 6/2002 | Tauchen | |
| 6,493,794 B1 | 12/2002 | Yamashita | |
| 6,526,505 B1 | 2/2003 | Epstein | |
| 6,560,696 B1 | 5/2003 | Hummel | |
| 6,678,806 B1 | 1/2004 | Redford | |
| 6,725,347 B2 | 4/2004 | Yang | |
| 6,745,216 B1 | 6/2004 | Nakamura | |
| 6,765,832 B1 | 7/2004 | Ohtani | |
| 6,820,186 B2 | 11/2004 | Webber et al. | |
| 6,834,005 B1 | 12/2004 | Parkin | |
| 7,027,338 B2 | 4/2006 | Lee | |
| 7,051,153 B1 | 5/2006 | Lin et al. | |
| 7,093,084 B1 | 8/2006 | Leblanc | |
| 7,228,391 B2 | 6/2007 | Silvera et al. | |
| 7,293,132 B2 | 11/2007 | Hurley | |
| 7,308,553 B2 | 12/2007 | Liang | |
| 7,463,056 B1 | 12/2008 | Anderson | |
| 7,474,574 B1 | 1/2009 | Agarwal et al. | |
| 7,502,896 B2 | 3/2009 | Isani et al. | |
| 7,508,701 B1 | 3/2009 | Liang et al. | |
| 7,570,611 B2 | 8/2009 | Stone | |
| 7,573,310 B2 | 8/2009 | Yang et al. | |
| 7,608,849 B2 | 10/2009 | Ino et al. | |
| 7,616,519 B2 | 11/2009 | Komatsu et al. | |
| 7,653,895 B1 | 1/2010 | James-Roxby et al. | |
| 7,728,327 B2 | 6/2010 | Kim et al. | |
| 7,791,376 B2 | 9/2010 | Lim et al. | |
| 7,864,560 B2 | 1/2011 | Tran | |
| 7,962,821 B2 | 6/2011 | Tokunaga et al. | |
| 7,983,068 B2 | 7/2011 | Ufert | |
| 8,510,503 B2 | 8/2013 | Yagihashi | |
| 8,717,831 B2 | 5/2014 | Hadley | |
| 8,972,630 B1 | 3/2015 | Stark | |
| 2002/0089024 A1 | 7/2002 | Iwata | |
| 2002/0138715 A1 | 9/2002 | Minematsu | |
| 2002/0194401 A1 | 12/2002 | Sakugawa | |
| 2003/0147488 A1 | 8/2003 | Nakamura | |
| 2004/0019715 A1 | 1/2004 | Apfeldorfer | |
| 2004/0027863 A1 | 2/2004 | Lee et al. | |
| 2004/0201010 A1 | 10/2004 | Ugajin | |
| 2004/0205304 A1 | 10/2004 | McKenney | |
| 2004/0239606 A1 | 12/2004 | Ota | |
| 2005/0127524 A1 | 6/2005 | Sakamoto et al. | |
| 2005/0138501 A1 | 6/2005 | Motika et al. | |
| 2005/0163277 A1 | 7/2005 | Georgakos | |
| 2006/0274585 A1 | 12/2006 | Jung | |
| 2007/0080345 A1 | 4/2007 | Joo et al. | |
| 2007/0083571 A1 | 4/2007 | Meller et al. | |
| 2007/0165446 A1 | 7/2007 | Oliva et al. | |
| 2007/0211531 A1 | 9/2007 | Atti et al. | |
| 2007/0262408 A1 | 11/2007 | Takagi et al. | |
| 2007/0267627 A1 | 11/2007 | Joo et al. | |
| 2007/0294469 A1 | 12/2007 | Teruyama | |
| 2008/0071748 A1 | 3/2008 | Wroblewski et al. | |
| 2008/0117700 A1 | 5/2008 | Nakamura | |
| 2009/0010043 A1 | 1/2009 | Gonzalez et al. | |
| 2009/0193384 A1 | 7/2009 | Sima et al. | |
| 2009/0294869 A1 | 12/2009 | Chen | |
| 2009/0323445 A1 | 12/2009 | Adams et al. | |
| 2010/0023730 A1 | 1/2010 | Leeland | |
| 2010/0141322 A1 | 6/2010 | Chua-Eoan | |
| 2010/0164972 A1 | 7/2010 | Akerib | |
| 2010/0193824 A1 | 8/2010 | Kim et al. | |
| 2011/0022791 A1 | 1/2011 | Iyer et al. | |
| 2011/0026314 A1 | 2/2011 | Hamouche et al. | |
| 2011/0063893 A1 | 3/2011 | Behera et al. | |
| 2011/0085390 A1 | 4/2011 | Arsovski et al. | |
| 2011/0106742 A1 | 5/2011 | Pino | |
| 2012/0104346 A1 | 5/2012 | Yi et al. | |
| 2012/0138885 A1 | 6/2012 | Wu et al. | |
| 2013/0048950 A1 | 2/2013 | Levy et al. | |
| 2013/0106480 A1 | 5/2013 | Ribeiro et al. | |
| 2013/0282974 A1 | 10/2013 | Joisha | |
| 2014/0126309 A1 | 5/2014 | Kelly | |
| 2014/0297985 A1 | 10/2014 | Graefe | |
| 2014/0304467 A1 | 10/2014 | Pickett | |
| 2014/0310453 A1 | 10/2014 | Golab | |
| 2014/0379977 A1 | 12/2014 | Perner | |
| 2015/0006809 A1 | 1/2015 | Harizopoulos | |
| 2015/0046644 A1 | 2/2015 | Karp | |

FOREIGN PATENT DOCUMENTS

| | | |
|---|---|---|
| CN | 101336447 | 12/2008 |
| CN | 101594319 A | 12/2009 |
| CN | 101673804 | 3/2010 |
| EP | 0237337 A2 | 9/1987 |
| EP | 0827156 | 4/1998 |
| EP | 1617482 A2 | 1/2006 |
| GB | 2390179 | 12/2003 |
| JP | 63231798 | 9/1988 |
| JP | 5066921 | 9/1993 |
| JP | 2005071500 | 3/2005 |
| JP | 2009099165 A | 5/2009 |
| JP | 2010238284 A | 10/2010 |
| KR | 102006000619 | 1/2006 |
| WO | WO-9314459 | 7/1993 |

OTHER PUBLICATIONS

Athanassoulis et al., MASM: Efficient Online Updates in Data Warehouses, ACM Special Interest Group on Management of Data Conference, Jun. 2011. 12 pages.

Bender et al., Insertion Sort is O (n log n). In Proceedings of the Third International Conference on FunWith Algorithms (FUN), 2004 (6 pages).

(56) References Cited

OTHER PUBLICATIONS

Boriskov, P.P. et al., Metal-insulator Transition in Electric Field: a Viewpoint from the Switching Effect, (Research Paper), Feb. 28, 2006, 18 Pages.

Chen, F. et al., S-shaped Negative Differential Resistance Modeling in Electro-therrnal Simulation of Phase-change Memory Programming, (Research Paper), Non-Volatile Memory Technology Symposium, Nov. 10-13, 2007, pp. 67-70.

Chen-Yi Lee et al., "High-Speed Median Filter Designs Using Shiftable Content-Addressable Memory," IEEE Trans. Circuits and Systems for Video Tech., vol. 4, No. 6, Dec. 1994, pp. 544-549.

Chijonovskii, F.A. et al., Switching Phenomena in Chromium-doped Vanadium Sesguioxide, (Research Paper), Journal of Applied Physics, Sep. 1, 1998, pp. 2643-2645, vol. 84, No. 5.

Chudnovskiy, F. et al., "Switching Device Based on First-order Metalinsulalor Transition induced by External Electric Field," IEEE Future Trends in Microelectronics: the Nano Millennium, Wiley Interscience, 2002, pp. 148-155.

European Patent Office, Extended EP Search Report, Application No. 11868835.7-1805 dated Feb. 3, 2015 (8 pages).

Graefe, G., "B-tree Indexes, Interpolation Search,and Skew," IEEE Proceedings of the Second international Workshop on Data Management on New Hardware (DaMoN 2006), Jun. 25, 2006, Chicago, IL (10 pages).

Han et al., Integer Sorting in (n $\sqrt{loglog}$ n) Expected Time and Linear Space, 2002 (10 pages).

Hikita. Y. et al., Negative Differential Resistance Induced by Mn Substitution at SrRuO3/Nb:SrTiO3 Schottky Interfaces, (Research Paper), Journals of American Physical Society, Mar. 19, 2008, vol. 77, No. 20., 14 Pages.

IEEE P1003.1, Draft 6, Apr. 2001/Open Group Technical Standard, Issue 6, Draft Standard for Information Technology—Portable Operating System Interface (POSIX) (23 pages).

International Searching Authority, The International Search Report and the Written Opinion, Feb. 9, 2012, 8 Pages.

International Searching Authority, The International Search Report and the Written Opinion, Feb. 9, 2012, 9 Pages.

International Searching Authority, The International Search Report and the Written Opinion, Jan. 17, 2013, 10 Pages.

International Searching Authority, The International Search Report and the Written Opinion, Nov. 28, 2012, 9 Pages.

International Searching Authority, The International Search Report and the Written Opinion, May 31, 2012, 10 Pages.

Lee et al., "High-Speed Median Filter Designs Using Shiftable Content-Addressable Memory," IEEE Trans. Circuits and Systems for Video Tech,V4, #6, Dec. 1994,544-549.

Mikkel Thorup, Chapter 1—on RAM priority queues, 1996 (9 pages).

PCT Search Report, PCT/US2011/058461, May 31, 2012, 3 Pgs.

Pot Search Report/Written Opinion~Application No. PCT/US2011/042223 dated Jan. 2, 2012~8 pages.

Pickett et al., "Coexistence of Memristance and Negative Differential Resistance in a Nanoscale Metal-Oxide-Metal System," IEEE Advanced Materials, 2011, pp. 23, 1730-1733.

Roberto Perez-Andrade et al., "A Versatile Linear Insertion Sorter Based on a FIFO Scheme," IEEE Computer Society Annual Symposium on VLSI, 2008, pp. 357-362.

Stephen C. Johnson, Algorithms for the 21st century presented at the 2006 USENIX Annual Technical Conference, Boston, MA, vol. 31, No. 5 (7 pages).

Supplementary European Search Report, Mar. 5, 2015, European Patent Application No. 11874593.4, 3 pages.

U.S. Appl. No. 14/349,678, Non-Final Rejection dated Oct. 14, 2015, pp. 1-25 and attachments.

Youn, D.H. et al., Observation of Abrupt Metallic Transitions in p-Type GaAs Devices and Comparison with Avalanche Breakdown in the InGaAs APD, (Research Paper), Journal of the Korean Physical Society, Jul. 1, 2005, pp. 1-5, vol. 47, No. 1.

\* cited by examiner

WORD SHIFT STATIC RANDOM ACCESS MEMORY (WS-SRAM)

CROSS-REFERENCE TO RELATED APPLICATIONS

N/A

STATEMENT REGARDING FEDERALLY SPONSORED RESEARCH OR DEVELOPMENT

N/A

BACKGROUND

Modern computers and related processing systems typically include a processor and some form of memory. The processor is generally responsible for performing the various computational tasks of the computer while the memory stores data that is used in and generated by the computational tasks. The architectural division of processing by the processor and data storage by the memory has proven successful for nearly the entire history of such systems.

For example, a typical general-purpose computer usually includes a central processing (CPU) and a main memory that communicate with one another over one or more communication channels (e.g., data, command and address buses). Typically, the CPU provides facilities to perform various arithmetic and logical operations, to provide operational sequencing, and to otherwise control aspects of the general-purpose computer. For example, virtually all CPUs provide functions or operations for reading data from memory, writing data to memory, and executing programs comprising a set of instructions that utilizes the data to perform a predefined task. In addition, CPUs may handle input/output (I/O) allowing communication with peripherals as well as subsystems outside of the general-purpose computer. CPUs may even provide graphics processing to handle generating and updating a graphical display (e.g., a monitor), in some examples.

In contrast, the main memory of modern computers, which can include one or more of static random access memory (SRAM), dynamic random access memory (DRAM), read-only memory (ROM), programmable ROM (PROM), flash memory and a variety of other memory types, typically provides a relatively narrow set of capabilities. Principal among these capabilities is storing computer programs and data that are executed and used by the CPU. Among other limited capabilities that may be found in, or that are often associated with, the main memory of modern computers are certain memory management functions. For example, DRAM memory subsystems of main memory may possess circuitry for automatic refresh of data stored therein.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Figure 1A:
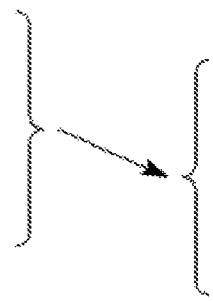
FIG. 1A illustrates an example of a downshift of a contiguous subset of data stored in a 2-D array within WS-SRAM, according to an example consistent with of the principles described herein.

Certain examples have other features that are one of in addition to and in lieu of the features illustrated in the above-referenced figures. These and other features as detailed below with reference to the above-reference figures.

DETAILED DESCRIPTION

Examples in accordance with the principles described herein provide a shiftable memory with built-in shifting capability. In particular, a contiguous subset of data stored as 'data words' in selected rows and columns of the shiftable memory is shifted by the shiftable memory to implement the built-in shifting capability. As such, the shiftable memory described herein may be referred to as a 'word shift' shiftable memory. Further, the word shift shiftable memory may employ static random access memory (SRAM) and thus may be referred to as word shift SRAM (WS-SRAM), according to various examples. The built-in data shifting capability of WS-SRAM provides a translation of the contiguous subset of data words within the WS-SRAM. The translation may be one or both of an upshift and a downshift of the stored data, according to various examples. Moreover, a direction of the shift (i.e., up or down) as well as an amount or distance of the shift may be selectable, in some examples. Examples in accordance with the principles described herein have application in computer systems and related data processing systems. In particular, examples described herein provide WS-SRAM that may be useful for a wide variety of data processing systems and data processing tasks performed by such systems.

According to various examples, the contiguous subset of stored data organized as a group of data words may be shifted within the memory from a first memory location to a second memory location within the WS-SRAM. The shifted group of data words retains an ordered relationship within the contiguous subset when shifted to the second location, according to some examples. Moreover, the shift takes place entirely within the WS-SRAM (e.g., within a memory chip or chip set that implements the WS-SRAM) and the shift is generally accomplished without using resources, such as a processor, that are outside of the WS-SRAM. In particular, the shift of data words may be accomplished using shift logic comprising circuitry (e.g., a shift circuit) of memory cells that make up the WS-SRAM, according to various examples. Further, the shift does not involve data being moved between a processor and the memory, according to various examples.

In some examples, the shift provided by the WS-SRAM may be employed to 'open' a location in memory into which a new data word or data words may be inserted. In particular, a memory location either above or below the contiguous subset of stored data words may be rendered available for data insertion when the contiguous subset of stored data words is moved by the shift within the WS-SRAM.

In some examples, the shift may be used to delete or 'overwrite' data stored at a terminal or 'delete' end of the contiguous subset of data words. In particular, the data word stored either above or below the contiguous subset may be overwritten with a data word of the contiguous subset itself, when the contiguous subset of data is shifted. In other examples, for example when the contiguous subset of data words is located at a physical end or boundary of the WS-SRAM, shifting the contiguous subset may substantially shift a portion (i.e., a data word) of the data off the physical end of (or substantially out of) the WS-SRAM. Depending on a direction of the shift, the data word may be shifted off of either the top end or the bottom end of the WS-SRAM, for example. Data words shifted off the physical end may be substantially 'lost' or removed from the shiftable memory and thus be considered deleted, according to some examples. Moreover, when the data word is deleted by being shifted off the physical end of the WS-SRAM, data deletion may occur without overwriting the data word, in some examples.

According to some examples, shifting data to either insert data words or delete data words in the WS-SRAM, may be accomplished in less time, and in some examples in considerably less time, than is generally possible without using WS-SRAM. In fact, the shift may be accomplished in substantially constant time (e.g., a fixed number of clock cycles) using WS-SRAM, according to some examples. For example, the shift may be accomplished in one, two or three 'clock cycles' of the WS-SRAM, according to some examples.

In contrast, conventional memory that relies on a processor, for example, to perform a shift generally requires an amount of time that is proportional to an amount of data being shifted. For example, shifting data in conventional memory typically involves the processor reading the data to be shifted and then writing the data back to memory in another location. Reading and writing may be performed by the processor on a word-by-word basis due to the structure and functionality of conventional memory, for example. Since each piece of data (e.g., data word) in the data being shifted is first read from the conventional memory by the processor and then subsequently written back to the conventional memory, the time to shift the data is generally proportional to the amount or length of the data (e.g., number of data words) being shifted, for example. The larger the amount of data, the longer the shift operation will take.

Moreover, conventional memory relies on a resource (e.g., the processor) that is external to the conventional memory to perform the reading and writing when shifting the data. Since the resource performing the shift is external to the conventional memory, each of the data words involved in the word-by-word shift must pass between the external resource and the conventional memory through some form of data bus or similar communication channel. The data bus or similar communication channel may substantially limit a speed of the read and write operations and as a result, an overall speed of the shift. Hence, shifting large subsets of data can become prohibitively expensive in terms of the processing time due to one or both of the effects of data bus speed and the proportional time aspects of performing a shift using conventional memory.

In accordance with the principles described herein, WS-SRAM has built-in shifting capability so that data words are not read and then written by an external resource to perform a shift, for example. The contiguous subset of stored data words is identified to the WS-SRAM (e.g., using an address and a length) and the WS-SRAM is instructed to shift the contiguous subset. The shift is then accomplished by and takes place entirely within the WS-SRAM. Speed limitations associated with transferring data to and from an external resource are substantially eliminated by WS-SRAM, according to examples of the principles described herein. Moreover, time for shifting may be substantially independent of the length of the contiguous subset, for example.

In particular, shifting within the WS-SRAM may be implemented with circuitry of the WS-SRAM itself, according to the principles described herein. As such, shifting using WS-SRAM does not require sequentially reading and writing each data word of the contiguous subset. For example, shifting using WS-SRAM may shift all of the data words in the contiguous subset in a substantially simultaneous manner. As such, the WS-SRAM may implement shifting of the contiguous subset in a time that is substantially independent of the length of the contiguous subset of data words.

As mentioned above, in some examples, the WS-SRAM may perform the shift in substantially constant time, according to examples of the principles described. By 'constant time' it is meant that a substantially similar amount of time is required to shift the contiguous subset of stored data words regardless of the length of the contiguous subset. For example, an arbitrary length contiguous subset may be shifted in a single clock cycle, according to some examples. In another example, a shorter contiguous subset may need only a single clock cycle while a longer contiguous subset may require two or more clock cycles. However, while the WS-SRAM may use more time for longer subsets than relatively shorter subsets, the shift is still performed sufficiently quickly such that the shift can be viewed as occurring in substantially constant time since the time required is not strictly proportional to the contiguous subset length, according to some examples.

Herein, the term 'memory' refers to substantially any sort of memory that can receive and store data using cross-coupled elements. The memory is generally consistent with memory that may be employed by a computer processor or in a computer system as static main memory that retains data without need for periodic data refresh, for example. Other types of static memory according to the definition herein include, but are not limited to, various types of latches, flip-flops, and shift registers that employ one or both of latches and flip-flops, for example.

In particular, by definition herein, memory used for WS-SRAM generally refers to any sort of memory that is or may be referred to as static random access memory (SRAM). SRAM is memory that substantially maintains data without needing to be refreshed, by definition herein. Typically, SRAM maintains data (e.g., as a programmed logic state) using a feedback loop or a cross-coupling between components or elements of the SRAM cell. For example, the cross-coupled elements may include, but are not limited to, cross-coupled inverters, cross-coupled NAND gates and cross-coupled NOR gates. Certain feedback loops used to implement some forms of SRAM or SRAM-like circuits are also considered as cross-coupled elements, by definition herein. Further herein, WS-SRAM employs, by definition, a particular and unique type of SRAM cell referred to a 'word shift' static random access memory (WS-SRAM) cell. The WS-SRAM cell is described in more detail below.

Also herein, a memory (e.g., a WS-SRAM) may comprise a plurality of memory cells (e.g., WS-SRAM cells or mixture of WS-SRAM cells and other memory cells) arranged as an array, according to various examples. For example, the memory cells may be arranged as a two dimensional (2-D) array. The 2-D array may be arranged as a rectangular 2-D array of memory cells comprising a plurality of rows (i.e., a plurality of horizontally oriented linear arrays) and a plurality of columns (i.e., a plurality of vertically oriented linear arrays), for example. As used herein, a 'row' is defined as a collection or grouping of memory cells arranged in a one-dimensional (1-D) array (e.g., a linear array). Similarly, a 'column' is defined as a collection of grouping of memory cells arranged in another linear array that is or may be oriented perpendicular to a row in the 2-D array. As such, the 2-D array may comprise a plurality of rows arranged in a substantially parallel manner and a plurality of columns, also parallel to one another, that are orthogonal to the rows, for example. In general, a particular memory cell is a member of both a row (e.g., row 5) and a column (e.g., column 8). Higher order (e.g., three or more dimensions) arrays also may be employed.

In some examples, a lower order array (e.g., a linear array) is defined on an array with a larger dimension (e.g., 2-D array). A three dimensional (3-D) arrangement of memory cells may be realized using a plurality of adjacent 2-D arrays, according to some examples. In addition, arrays may be divided into sub-arrays. For example, a 2-D rectangular array may be divided into quadrants as four sub-arrays. In another example, the 2-D rectangular array may be divided into subgroups of adjacent columns. In some examples, the column subgroups may have a width corresponding to a number of memory cells used to hold or represent a data word as is discussed below.

Further herein, a row comprising a grouping of memory cells may hold data (e.g., a plurality of data bits) that constitute one or more date words of a particular computer system. According to various examples, the memory cells of a row are physically adjacent to one another. For example, a first memory cell of a row may be located immediately next to a second memory cell of the row, and so on from the beginning end (e.g., left end) of the row to the terminal end (e.g., right end) of the row. A row may comprise a relatively large number of memory cells. For example, a length of a row may be 1024 data bits, 2048 data bits, 4096 data bits, or more, in various practical implementations, according to examples in accordance with the principles described herein.

A memory cell (e.g., a WS-SRAM cell) is a circuit or a related construct that holds, retains or stores data, as defined and employed herein. Further, by definition herein, a memory cell may generally store a single 'bit' of data, according to some examples. For example, the bit may represent a binary value (e.g., '0' or '1') and the memory cell may hold a single, particular binary value at any given moment in time. Also by definition herein, a data word may comprise one or more bits of data generally stored in one or more adjacent memory cells. For example, a data word may comprise 4, 8, 16, 32 or 64 binary bits stored in a corresponding number of memory cells. The memory cells may be adjacent memory cells, for example. In some examples, the adjacent memory cells that store a data word are arranged in or along a length of a row of the array of memory cells. Similarly, data words may be arranged in or along a length or extent of a subgroup of columns. For example, each row of the column subgroup may hold a different one of a plurality of data words. The subgroup of columns may be referred to as a data word column or even a column for simplicity of discussion.

Memory cells (e.g., WS-SRAM cells of WS-SRAM) organized in rows and columns of a 2-D array are also often referred to as 'memory locations' herein. Strictly speaking, a memory location is a memory cell(s) at a particular location within the memory, the location being designated or identified by an address (e.g., of a particular row and a particular column). The memory cell may be accessed using the address, for example. However, for simplicity of discussion herein, the memory cells themselves are often referred to as having or being at an address. Similarly, a data word comprising a plurality of memory cells may be designated or identified by an address, in some examples. The address may correspond to an address of a first memory cell of the plurality that makes up the data word, for example. As such, a data word may be referred to as having or being at a memory location or equivalently at a data word location or data word address (or simply an 'address') in memory.

In addition, 'location' may be used to refer to a location of a contiguous subset of data words that is designated by a starting address (e.g., starting data word location or address) and an ending address (e.g., ending data word location or address), according to some examples. In some examples, a starting address may be referred to as an 'INSERT' address while an ending address may be referred to as a 'DELETE' address, for reasons that will be clear below.

Further herein and as noted above, a 'shift' as performed by the WS-SRAM is defined as a translation of a contiguous subset of data words stored within the WS-SRAM, unless otherwise stipulated. In particular, by definition herein, a shift using the WS-SRAM constitutes the translation (e.g., up or down) of the stored data words of the contiguous subset from a first location to a second location within the WS-SRAM. Furthermore, the shift, when applied to the contiguous subset of stored data words, translates all of the stored data words of the contiguous subset. Moreover, the shift by the WS-SRAM does not produce a translation or shift of data outside of the contiguous subset of data words involved in the shift, by definition herein. However, the contiguous subset may comprise all of the memory locations as well as all of the stored data words of the WS-SRAM, according to some examples.

According to some examples, WS-SRAM may be organized such that data word addresses are defined on columns, or more precisely column subgroups. In particular, addresses may increase from one end of a column subgroup to another end, according to some examples. Further, in some examples, WS-SRAM may be organized such that data word addresses are distributed across a plurality of columns or column subgroups in a serpentine manner. For example, addresses of a first column subgroup may increase from a top to a bottom of the column subgroup while addresses in an adjacent column subgroup may increase from the bottom to the top of the adjacent column subgroup. As such, addresses increase in a serpentine manner across successive adjacent column subgroups.

Moreover, adjacent column subgroups may be connected to one another in a serpentine manner to support shifting data words up or down sub-columns according to the serpentine-organized addresses. By definition, a serpentine connection of columns is a connection that allows data transfer between bottoms and tops of adjacent columns to facilitate shifting of data in a serpentine manner along and among the adjacent columns. A serpentine connection of column subgroups is a serpentine connection of columns in the column subgroups that preserves the relationship between columns of the column subgroup. For example, a first column of the column subgroup is connected in a serpentine connection to a first column of an adjacent column subgroup, a second column of the column subgroup is connected to a second column of the adjacent column subgroup, and so on. A physical beginning of the serpentine connected columns or column subgroups may be at a top of the first column subgroup in the serpentine connection, for example. Similarly, a physical end may be at a bottom of a last column or column subgroup in the serpentine connection, according to some examples.

Herein, the direction 'up' is defined within the WS-SRAM as a direction toward locations having smaller addresses. The direction 'down' is defined as a direction toward locations having larger addresses. Hence, an 'upshift' is defined as shifting the data to a second location having a smaller address than an address of a first or starting location. Conversely, a 'downshift' results in moving the data from a first location having a smaller address to a second location with a larger address. However, while the shift direction may be controllable or selectable according to some examples, the shift direction (e.g., up or down) may be completely arbitrary, as employed herein. Further, the specific use of 'upshift' and 'downshift' herein is for discussion purposes and not by way of limitation.

FIG. 1A illustrates an example of a downshift of a contiguous subset of data stored in a 2-D array within a WS-SRAM, according to an example consistent with of the principles described herein. In particular, FIG. 1A illustrates a plurality of memory cells, each memory cell of which is capable of storing a single binary value or bit (e.g., a '1' or '0'), by way of example. As illustrated, the memory cells are organized in a column subgroup representing individual data words along a length (or height) thereof. Further as illustrated, each of the data words, or more specifically each location of a data word, is identified by an address ranging from 00 to 11. The addresses may also represent row addresses corresponding to both the column subgroup and to a 2-D array that includes the column subgroup, in various examples. A left side of FIG. 1A illustrates the plurality of data words before the downshift while a right side illustrates the plurality of data words after the downshift.

As illustrated, the example downshift within the WS-SRAM comprises selecting a contiguous subset of stored data words starting at address 04 and ending at address 08, for example. The WS-SRAM then downshifts the selected contiguous subset of data words by moving the stored data words down one location, as illustrated in the right side of FIG. 1A. The downshift maintains an order of the data words within the contiguous subset and deposits the contiguous subset in a new location delineated by address 05 and address 09. Downshifting the stored data words overwrites or substantially deletes the contents of data word location immediately below the contiguous subset (i.e., contents at address 09 before the downshift) and replaces the contents of that data word location with a last data word of the downshifted contiguous subset (e.g., contents of address 08 before the downshift). Hence, the data word location at address 09 may be referred to as the DELETED address, as illustrated.

Further, the contents of the data word location at address 04 is downshifted to the data word location at address 05 and after the downshift, the data word location at address 04 is rendered indeterminate as indicated by the X's, as illustrated. According to various examples, the data word location at address 04 may retain a copy of the data word that was resent before the downshift or may be cleared (e.g., set to '000 . . . ') after the downshift. In some examples, the data word location at address 04 may be available for insertion of a data word from an external source, for example. As such, the data word location at address 04 is denoted as the INSERT address, according to some examples.

Figure 1B:
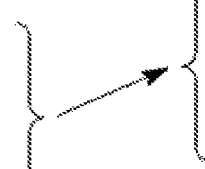
FIG. 1B illustrates an example of an upshift of a contiguous subset of data stored in a 2-D array within a WS-SRAM, according to an example consistent with the principles described herein.

FIG. 1B illustrates an example of an upshift of a contiguous subset of data stored in a 2-D array within a WS-SRAM, according to an example consistent with the principles described herein. In particular, FIG. 1B illustrates a plurality of memory cells that are substantially similar to the memory cells illustrated in FIG. 1A. As illustrated, the memory cells are organized in a column subgroup representing individual data words with each of the data words, or more specifically each location of a data word, being identified by an address ranging from 00 to 11, also substantially similar to FIG. 1A. A left side of FIG. 1B illustrates the plurality of data words before the upshift while a right side illustrates the plurality of data words after the upshift.

As illustrated in FIG. 1B, the upshift in shiftable memory comprises selecting contiguous subset of stored data words starting with a data word location at address 03 and ending with a data word location at address 06, for example. The shiftable memory then upshifts the selected contiguous subset by moving the stored data words in the selected contiguous subset up one address location, as illustrated in the right side of FIG. 1B. The upshift maintains an order of the data words within the contiguous subset and deposits the contiguous subset into data word locations between address 02 and row address 05. Upshifting the stored data words overwrites the contents of a data word location immediately above the contiguous subset (i.e., at address 02) and as such, replaces the contents of that data word location with a first data word of the upshifted contiguous subset (i.e., contents at address 03 before the upshift). Further, the data word location at address 06 which originally held the last data word of the contiguous subset before the upshift is rendered indeterminate as indicated by the X's after the upshift. According to some examples, the data word location at address 06 may retain a copy of the data word that was present before the upshift or may be cleared (e.g., set to '000 . . . ') after the upshift. In some examples, the data word location at address 06 may be available for insertion of a data word from an external source, for example. As such, the data word location at address 06 may be considered the INSERT address while the data word location at address 02 may be denoted as the DELETE address, according to the example illustrated in FIG. 1B.

Note that for the upshift, the DELETE address is at a smaller address than (i.e., is above) the INSERT row while for the downshift the DELETE address has a larger address than (i.e., is below) the INSERT row, as illustrated. Also note that the shift direction is from the INSERT address to the DELETE address, as illustrated.

According to various examples, the WS-SRAM may be a portion of a main memory of a general-purpose computer system. The WS-SRAM may represent a subset of the memory that makes up the main memory, for example. In another example, the WS-SRAM may be a shift register. The shift register may have a single memory cell in each row, for example. In another example, the shift register may have a full data word in each row and thus comprise a plurality of columns.

Further, as used herein, the article 'a' is intended to have its ordinary meaning in the patent arts, namely 'one or more'. For example, 'a memory cell' means one or more memory cells and as such, 'the memory cell' means 'the memory cell(s)' herein. Also, any reference herein to 'top', 'bottom', 'upper', 'lower', 'up', 'down', 'front', 'back', 'left' or 'right' is not intended to be a limitation herein. Further, the terms 'column' and 'row' are arbitrary designations to describe substantially orthogonal structures when employed in or describing an array. As such, a row may be viewed as a column and a column may be viewed as a row under an appropriate rotation of an array or similar structure containing the rows and columns. Herein, the term 'about' when applied to a value generally means within the tolerance range of the equipment used to produce the value, or in some examples, means plus or minus 10%, or plus or minus 5%, or plus or minus 1%, unless otherwise expressly specified. Moreover, examples herein are intended to be illustrative only and are presented for discussion purposes and not by way of limitation.

Figure 2:
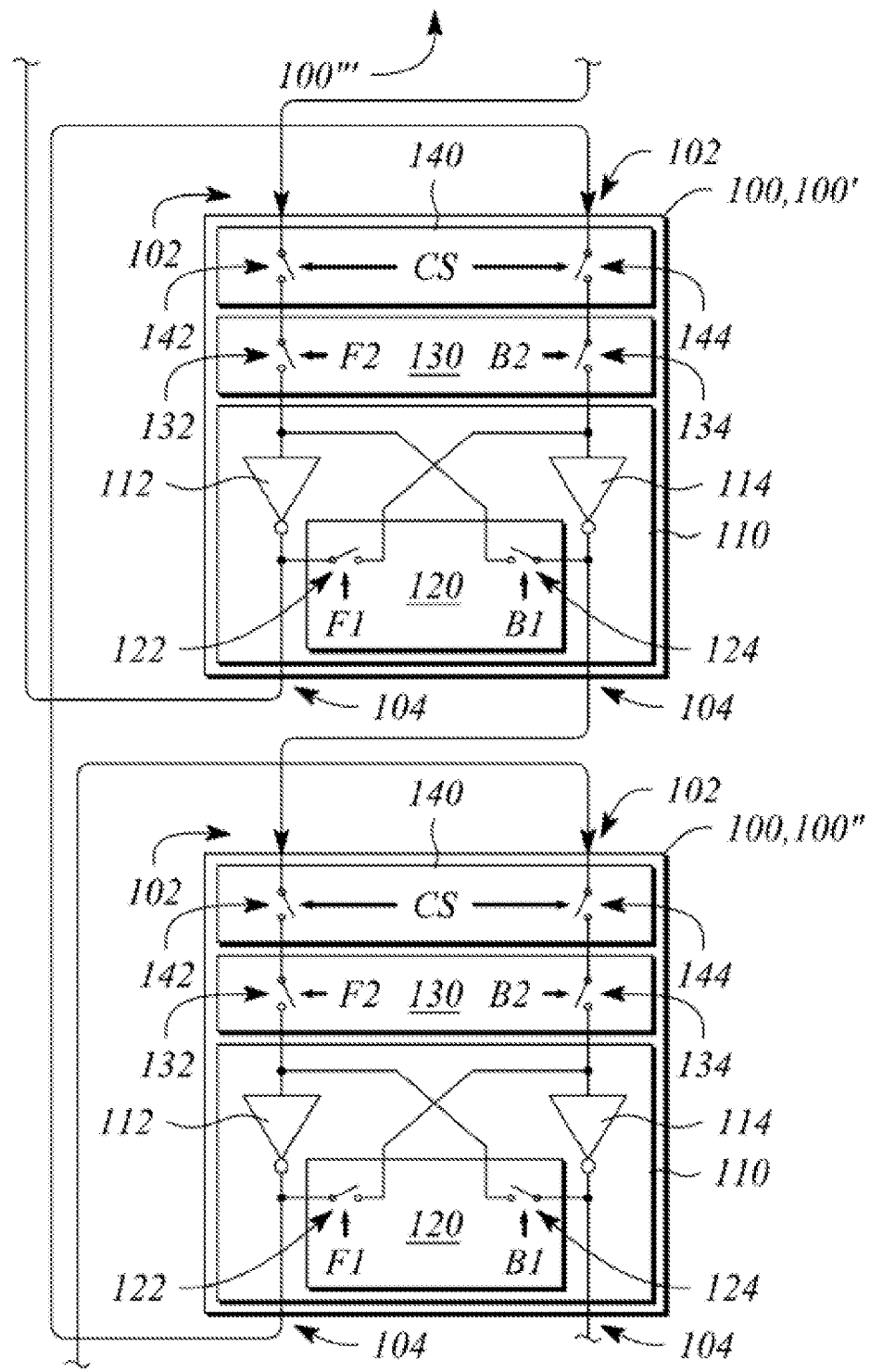
FIG. 2 illustrates a block diagram of a word shift static random access memory (WS-SRAM) cell, according to an example consistent with the principles described herein.

FIG. 2 illustrates a block diagram of a word shift static random access memory (WS-SRAM) cell 100, according to an example consistent with the principles described herein. According to various examples, the WS-SRAM cell 100 is a memory cell that provides both a dynamic storage mode and a static storage mode, by definition herein. In particular, the WS-SRAM cell 100 may be selectably operated in or switched in situ between the dynamic storage mode and the static storage mode. When operated in static storage mode, the WS-SRAM cell 100 acts substantially similar to an SRAM cell to maintain stored data without refresh. Alternatively, when switched to dynamic storage mode, the WS-SRAM cell 100 exhibits a time decay of stored data that substantially mimics dynamic random access memory (DRAM), for example. The time decay may be provided by a capacitance (e.g., a gate capacitance) of an element or elements of the WS-SRAM cell 100, for example. According to some examples, the dynamic storage mode is employed when the WS-SRAM cell 100 is operated as a load/store shift register.

As illustrated, the WS-SRAM cell 100 has two input ports at input 102 (the terms 'input port' and 'input' may be used interchangeably) to receive data and two output ports at output 104 (the terms 'output port' and 'output' may be used interchangeably) to output data stored by the WS-SRAM cell 100. In some examples, the input port 102 and the output port 104 may be employed to one or both of shift data into and shift or couple data out of the WS-SRAM cell 100. Specifically, when the WS-SRAM cell 100 is operated as a load/store shift register utilizing a combination of the dynamic storage mode to load data and the static storage mode to store the loaded data, the load/store input port 102 may be connected to an adjacent memory cell (e.g., an adjacent WS-SRAM cell 100) that supplies the data being loaded, according to some examples. Further in some examples, the output port 104 may be connected to another adjacent memory cell (e.g., another WS-SRAM cell 100) for shifting or coupling data out of the WS-SRAM cell 100, for example.

In some examples, the WS-SRAM cell 100 may have other input/output (I/O) ports (not illustrated FIG. 2). For example, the WS-SRAM cell 100 may have one or more other I/O ports in communication with a bit line or a pair of bit lines of a memory array that employs the WS-SRAM cell 100. The other I/O ports may be used to one or both of write data to and read data from the WS-SRAM cell 100 when the WS-SRAM cell 100 is operated in static storage mode as a memory cell of a random access memory array (e.g., as an SRAM array), for example. The bit line(s) are not explicitly depicted in FIG. 2 for simplicity of illustration, but will be addressed below (e.g., see FIGS. 3A-3B).

Further, FIG. 2 illustrates a plurality of WS-SRAM cells 100 arranged and interconnected in a column, by way of example and not limitation. As illustrated, an output port 104 of a particular WS-SRAM cell 100' of the plurality is connected to both of an input port 102 of an adjacent WS-SRAM cell 100'' below the particular WS-SRAM cell 100' and an input port of an adjacent WS-SRAM cell 100''' (as referenced, but not illustrated) above the particular WS-SRAM cell 100' in the column. In some examples (not illustrated), the particular WS-SRAM cell 100' may be connected to either the below-adjacent WS-SRAM cell 100'' or the above-adjacent WS-SRAM cell 100''', but not both. Connection to both adjacent WS-SRAM cells 100'', 100''' may facilitate selectable upshifting and downshifting of data within the column when the Ws-SRAM cells 100 are operated as a load/store shift register, for example. Alternatively, a single direction connection of the particular WS-SRAM cell 100', for example to either the below-adjacent WS-SRAM cell 100'' or the above-adjacent WS-SRAM cell 100''', may facilitate unidirectional (i.e., either downshift or upshift) data translation within the column. Also according to some examples (not illustrated), one or both of the adjacent WS-SRAM cells 100'', 100''' below and above the particular WS-SRAM cell 100' may be realized as other than a WS-SRAM cell (e.g., as a conventional SRAM cell). Further, the column illustrated in FIG. 2 may be either a stand-alone column (e.g., implementing a 1-bit wide shift register) or a representative column of a plurality of columns of a 2-D memory array, according to various examples.

Referring to FIG. 2, the WS-SRAM cell 100 comprises a static random access memory (SRAM) cell 110. According to various examples, the SRAM cell 110 is a memory cell configured to provide substantially static data storage without a need for data refresh to maintain the stored data. As illustrated, the SRAM cell 110 comprises a pair of cross-coupled elements 112, 114. The cross-coupled elements 112, 114 are configured to provide data storage through or as a result of a cooperative interaction or a 'cross coupling' between the cross-coupled elements 112, 114. In particular, the cross coupling of the cross-coupled elements 112, 114 may act as a signal feedback loop that cooperatively reinforces a programmable logic state of the SRAM cell 110 to store the data, according to various examples. A circuit (e.g., a driver) external to the SRAM cell 110 may provide programming of the programmed logic state, in some examples. For example, programming may be provided by a driver via bit lines (not illustrated). After programming, the cross coupling maintains the programmed logic state, according to some examples. In some examples, the cross-coupled elements 112, 114 of the SRAM cell 110 are also often referred to as latch or latch circuit.

In some examples, the cross-coupled elements 112, 114 comprise a pair of cross-coupled inverters 112, 114. In some examples, the pair of cross-coupled inverters 112, 114 may comprise a first inverter 112 cross-coupled by a cross-coupling connection to a second inverter 114. In some examples, the first and second inverters 112, 114 may be cross-coupled such that an output signal of the first inverter 112 is communicated by the cross-coupled connection to an input of the second inverter 114. Similarly, the cross-coupled connection may communicate an output signal of the second inverter 114 to an input of the first inverter 112, for example. The operation of the inverter 112, 114 in conjunction with the cross-coupling connection functions as a feedback or coupled circuit that is bi-stable having the capability to store data. In other examples (not illustrated in FIG. 2) elements other than or in addition to a pair of inverters 112, 114 may be employed as the cross-coupled elements 112, 114.

Further as illustrated, the WS-SRAM cell 100 further comprises a dynamic/static (D/S) mode selector 120. The D/S mode selector 120 is configured to selectably switch the WS-SRAM cell 100 between the dynamic storage mode and the static storage mode. When the D/S mode selector 120 switches the WS-SRAM cell 100 into static storage mode, the SRAM cell 110 maintains a programmed logic state substantially without decay or degradation (i.e., at least until the SRAM cell 110 is reprogrammed). Alternatively, when the D/S mode selector 120 selectably switches the WS-SRAM cell 100 to dynamic storage mode, the logic state previously stored in or by the SRAM cell 110 decays over time, by definition herein.

According to various examples, the D/S mode selector 120 is configured to produce the dynamic storage mode by interrupting the signal feedback loop of the SRAM cell 110. In particular, the signal feedback loop is interrupted by substantially breaking or decoupling the cross-coupling connection between the cross-coupled elements 112, 114 of the SRAM cell 110. Decoupling the cross-coupling connection also substantially isolates the cross-coupled elements 112, 114 from one another, according to some examples.

According to some examples, the D/S mode selector 120 comprises a switch to selectably couple and decouple/isolate the pair of cross-coupled elements 112, 114 of the SRAM cell 110. The dynamic storage mode of the WS-SRAM cell 100 corresponds to the cross-coupled elements 112, 114 being decoupled and the static storage mode corresponds to the cross-coupled elements being coupled. Thus, selectably decoupling the cross-coupled elements 112, 114 of the pair using the switch produces the dynamic storage mode of the WS-SRAM cell 100 while selectably coupling between the pair of cross-coupled elements 112, 114 with the switch provides the static storage mode, according to various examples.

In some examples, the switch may be located in or be a part of the cross-coupling connection. For example, the switch may comprise a first switch 122. The first switch 122 may be connected between the output of the first cross-coupled element 112 (e.g., first inverter 112) and the input of the second cross-coupled element 114 (e.g., second inverter 114) as part of the cross-coupling connection, for example. When the first switch 122 is turned off or is in an OFF condition (e.g., a high impedance condition or an open switch), the output of the first cross-coupled element 112 is substantially disconnected or decoupled and isolated from the input of the second cross-coupled element 114. Alternatively, when the first switch is turned on or in an ON condition (e.g., a low impedance condition or a closed switch), coupling is facilitated between the first cross-coupled element output and the second cross-coupled element input. The first switch 122 may be controlled by or according to a control signal F1, for example.

In some examples, the switch may further comprise a second switch 124. The second switch 124 may be connected, as part of the cross-coupling connection, between the output of the second cross-coupled element 114 (e.g., second inverter 114) and the input of the first cross-coupled element 112 (e.g., first inverter 112), for example. When the second switch 124 is turned off or in an OFF condition (e.g., a high impedance condition or an open switch), the output of the second cross-coupled element 114 is substantially disconnected or decoupled and isolated from the input of the first cross-coupled element 112. Alternatively, when the second switch is turned on or in an ON condition (e.g., a low impedance condition or a closed switch), coupling is facilitated between the second cross-coupled element output and the first cross-coupled element input. The second switch 124 may be controlled by or according to a control signal B1, for example.

According to some examples, the D/S mode selector 120 may configure the WS-SRAM cell 100 to operate in the dynamic storage mode when both of the first and second switches 122, 124 are in the OFF condition. The selectable decoupling provided by the first and second switches 122, 124 may substantially defeat the cross-coupling coupling of the cross-coupled inverters 112, 114, to provide the dynamic storage mode, according to some examples. Further, the selectably decoupling substantially isolates the cross-coupled inverters 112, 114 from one another. According to various examples, one or both of the first and second switches 122, 124 may comprise a transistor switch. Examples of a transistor switch include, but are not limited to, a series-connected metal oxide (MOS) transistor (e.g., an NMOS or a PMOS transistor) and a transmission gate comprising a parallel connection of an NMOS transistor and a PMOS transistor.

In some examples, the WS-SRAM cell 100 further comprises a load/store (L/S) coupler 130. The L/S coupler 130 is configured to selectably couple data (e.g., a logic '1' or a logic '0') from an external source into the WS-SRAM cell 100. The external data source may be an adjacent memory cell, for example. The data coupled by the L/S coupler 130 may be loaded by the WS-SRAM cell 100 in the dynamic storage mode and then subsequently stored in the WS-SRAM cell 100 when the WS-SRAM cell 100 is switched from dynamic storage mode to static storage mode following data loading, according to various examples.

In some examples, the L/S coupler 130 comprises a first switch 132. For example, the first switch 132 may be connected between a first load/store input of the input port 102 of the WS-SRAM cell 100 and the input of the first cross-coupled element 112 (e.g., the inverter 112) of the SRAM cell 110. The first switch 132 may be configured to selectably couple data from a first adjacent memory cell into the SRAM cell 110 when the first switch 132 is turned on or in an ON condition (i.e., ON=closed switch), for example. In an OFF condition (i.e., OFF-32 open switch), the first switch 132 substantially blocks coupling from the first adjacent memory cell, according to various examples. For the WS-SRAM 100', the first adjacent memory cell may be the above-adjacent WS-SRAM cell 100''' (not explicitly illustrated in FIG. 2), for example. The data coupling provided by the first switch 132 may facilitate downshifting data in a column having the WS-SRAM cell 100, for example.

In some examples, the L/S coupler 130 comprises a second switch 134. For example, the second switch 134 may be connected between a second load/store input of the input port 102 of the WS-SRAM cell 100 and the input of the second cross-coupled element 114 (e.g., the inverter 114) of the SRAM cell 110. The second switch 134 may be configured to selectably couple data from a second adjacent memory cell into the SRAM cell 110 when the second switch 134 is turned on or in an ON condition, for example. In an OFF condition, the second switch 134 substantially blocks coupling from the second adjacent memory cell, according to various examples. For the WS-SRAM 100', the second adjacent memory cell may be the below-adjacent WS-SRAM cell 100'' illustrated in FIG. 2, for example. The coupling provided by the second switch 134 may facilitate upshifting data in a column having the WS-SRAM cell 100, for example.

By definition herein, when the WS-SRAM cell 100 is in dynamic storage mode and the first switch 132 is employed to couple data into the first cross-coupled element 112, the first cross-coupled element 112 may be referred to as a 'master' (e.g., a 'master' inverter 112) while the second cross-coupled element 114 may be referred to as a 'slave' (e.g., a 'slave' inverter 114). Alternatively, when the WS-SRAM cell 100 is in dynamic storage mode and the second switch 134 is employed to couple data into the second cross-coupled element 114, the second cross-coupled element 114 may be referred to as a 'master' (e.g., a 'master' inverter 114) while the first cross-coupled element 112 may be referred to as a 'slave' (e.g., a 'slave' inverter 112), by definition herein. As such, the master cross-coupled element is a cross-coupled element 112, 114 of the pair that is configured by the L/S coupler 130 to receive data being loaded into the WS-SRAM cell 100 in dynamic mode. Further, the slave cross-coupled element is a cross-coupled element 112, 114 of the pair that is isolated from the master cross-coupled element. In some examples, the slave cross-coupled element of an adjacent WS-SRAM cell 100 may serve as a source of the data being coupled into the master cross-coupled element by the L/S coupler 130.

In some examples, the WS-SRAM cell 100 further comprises a column selector 140. The column selector 140 is configured to selectably determine whether or not the WS-SRAM cell accepts data shifted from an adjacent memory cell during the dynamic storage mode. In other words, the column selector 140 may enable data transfer into the WS-SRAM cell 100 when the column selector 140 is activated by definition, according to various examples. In some examples, the shifted data is coupled or transferred through the activated column selector 140 (e.g., using a closed switch) to accept the shifted data. Alternatively, the column selector 140 may block data transfer (e.g., using an open switch) when not activated, according to some examples. Data transfer may be in conjunction with an operation of the L/S coupler 130, according to some examples.

In some examples, the column selector 140 comprises a first column selector switch 142. The first column selector switch 142 may be connected in series with the first L/S coupler switch 132, for example. The first column selector switch 142 may be configured to selectably couple data into the WS-SRAM cell 100 when the first column selector switch 142 is turned on or in an ON condition (i.e., ON=closed switch), for example. In an OFF condition (i.e., OFF=open switch), the first column selector switch 142 substantially blocks data coupling, according to various examples.

In some examples, the column selector 140 further comprises a second column selector switch 144. The second column selector switch 142 may be connected in series with the second L/S coupler switch 134, for example. The second column selector switch 142 may be configured to selectably couple data into the WS-SRAM cell 100 when the second column selector switch 144 is turned on or in an ON condition (i.e., ON=closed switch), for example. In an OFF condition (i.e., OFF=open switch), the second column selector switch 144 substantially blocks data coupling, according to various examples.

The selectable coupling of data may be in conjunction with the L/S coupler 130, according to various examples. For example, selectable coupling of data into the first coupled element 112 by way of the first L/S coupler switch 132 may only occur when both of the first column selector switch 142 and the first L/S coupler switch 132 are activated or turned on. Similarly, selectable coupling of data into the second coupled element 114 by way of the second L/S coupler switch 134 may only occur when both of the second column selector switch 144 and the second L/S coupler switch 134 are activated or turned on, for example. In some examples, both of the first column selector switch 142 and the second column selector switch 144 may be activated by a column select (CS) signal. Further, all of the WS-SRAM cells 100 in a column or in a subgroup of columns may share a common CS signal, in some examples.

Figure 3A:
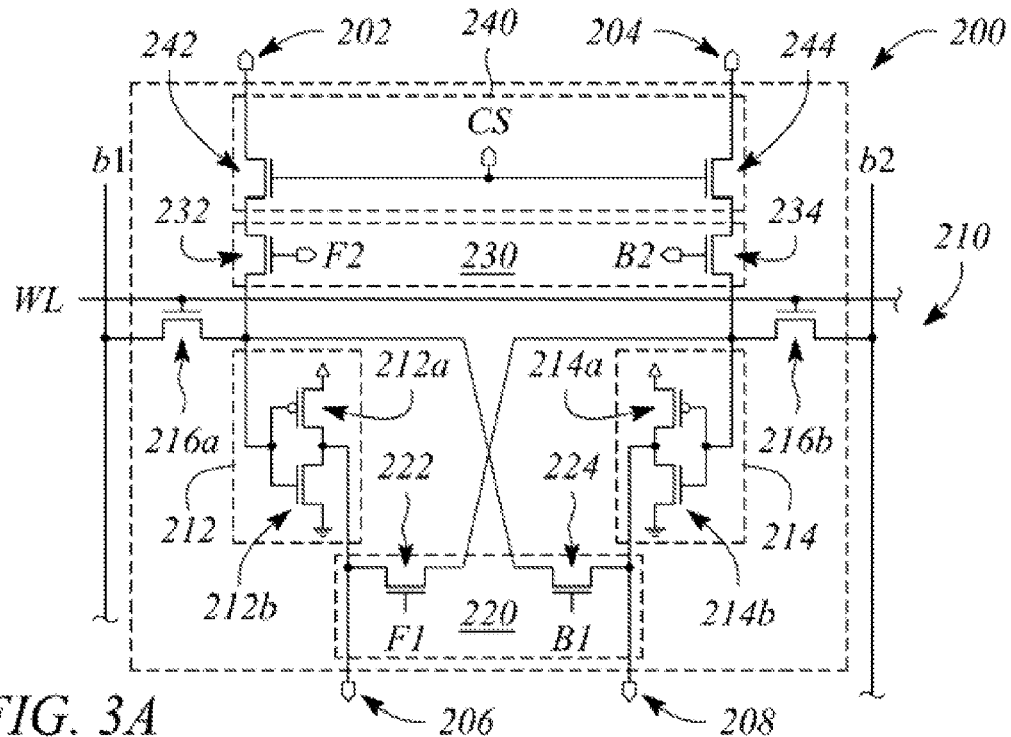
FIG. 3A illustrates a schematic diagram of a WS-SRAM cell, according to an example consistent with the principles described herein.

FIG. 3A illustrates a schematic diagram of a WS-SRAM cell 200, according to an example consistent with the principles described herein. According to some examples, the Ws-SRAM cell 200 illustrated in FIG. 3A may be substantially similar to the WS-SRAM cell 100 described above with respect to FIG. 2. In particular, the WS-SRAM cell 200 comprises an SRAM cell 210, a dynamic/static (D/S) mode selector 220, a load/store (L/S) coupler 230, and a column selector 240, each of which is substantially similar to respective ones of the SRAM cell 110, the D/S mode selector 120, the L/S coupler 130, and the column selector 140 of the WS-SRAM cell 100.

As illustrated in FIG. 3A, the SRAM cell 210 comprises a six transistor (6T) SRAM cell 210. The illustrated 6T SRAM cell 210 comprises a first inverter 212 implemented using a pair of transistors 212a, 212b and a second inverter 214 implemented using another pair of transistors 214a, 214b. A first or upper transistor 212a, 214a of each pair in the inverters 212, 214 are illustrated in FIG. 3A as PMOS transistors, while a second or lower transistor 212b, 214b of each pair in the inverters 212, 214 are illustrated as NMOS transistors by way of example and not limitation. The first inverter 212 is cross-coupled to the second inverter 214 by a cross-coupling circuit. The cross-coupled first and second inverters 212, 214 function to store data in the 6T SRAM cell 210. The 6T SRAM cell 210 further comprises a pair of access transistors 216a, 216b. The access transistors 216a, 216b connect to a pair of bit lines b1 and b2 to facilitate writing to and reading from the 6T SRAM cell 210 when the WS-SRAM cell 200 is operated as a memory cell of a random access memory in static storage mode. The access transistors 216a, 216b are activated by a word line WL and the bit lines b1 and b2 may be inverses of one another (e.g., b2=$\overline{b1}$), according to some examples.

As illustrated, the D/S mode selector 220 of the WS-SRAM cell 200 comprises a pair of transistor switches 222, 224 in the cross-coupling circuit between the first and second inverters 212, 214. Asserting a control signal (e.g., at ports F1 and B1) that places the pair of transistor switches 222, 224 in an OFF condition (i.e., turning off the transistor switches 222, 224) decouples and isolates the cross-coupling of the first and second inverters 212, 214 from one another to provide the dynamic storage mode of the WS-SRAM cell 200. The static storage mode is provided by a control signal (e.g., at ports F1 and B1) that places the transistor switches 222, 224 in an ON condition. As illustrated, the pair of transistor switches 222, 224 of the D/S mode selector 220 is illustrated as NMOS transistors. In other examples (not illustrated) the D/S mode selector 220 may comprise PMOS transistors or a combination of NMOS and PMOS transistors.

Further as illustrated, the L/S coupler 230 comprises a pair of transistor switches 232, 234. Asserting a control signal (e.g., at port F2) that places a first transistor switch 232 of the pair in an ON condition (i.e., turned on) allows data at a first load/store input 202 of the WS-SRAM cell 200 to be coupled into and affect a state of the first inverter 212. In particular, the state of the first inverter 212 may be affected by the data coupled through the first transistor switch 232 when the WS-SRAM cell 200 is in dynamic storage mode, for example. Further, when the first transistor switch 232 is turned on, the first inverter 212 is the master inverter. Similarly, asserting a control signal (e.g., at port B2) that places a second transistor switch 234 of the pair in an ON condition (i.e., turned on) allows data at a second load/store input 204 of the WS-SRAM cell 200 to be coupled into and affect a state of the second inverter 214 when the WS-SRAM cell 200 is in dynamic storage mode, for example. Further, when the second transistor switch 234 is turned on, the second inverter 214 is the master inverter. As illustrated, the pair of transistor switches 232, 234 of the L/S coupler 230 is illustrated as NMOS transistors. In other examples (not illustrated), the L/S coupler 230 may comprise PMOS transistors or a combination of NMOS and PMOS transistors.

Still further as illustrated, the column selector 240 comprises a pair of transistor switches 242, 244. Asserting a column select (CS) signal (e.g., at port CS common to both transistor switches 242, 244) places both transistor switches 242, 244 in an ON condition. In the ON condition, the transistor switches 242, 244 couple data into the WS-SRAM cell 200. Control signals F2, B2 at the first and second transistor switches 232, 234 of the L/S coupler 230 determine which of the first and second load/store ports 202, 204 provides the coupled data.

According to some examples, data in the WS-SRAM cell 200 may be coupled into an adjacent WS-SRAM cell 200 through one or both of an output port 206 and an output port 208, as illustrated. For example, the output port 206 of the WS-SRAM cell 200 may be connected to a first load/store input port of a below-adjacent WS-SRAM cell (not illustrated) to facilitate data downshifting. The output port 208 of the WS-SRAM cell 200 may be connected to a second load/store input port of an above-adjacent WS-SRAM cell (not illustrated) to facilitate data upshifting, for example. Further as illustrated, when data is coupled out of the output port 208, the second inverter 214 is the slave inverter. The first inverter 212 is the slave inverter when data is coupled out of the output port 206. Data may be selectably coupled out of the output ports 206, 208 by an L/S coupler of an adjacent WS-SRAM cell (not illustrated), for example.

As such, data may be loaded into and stored by the WS-SRAM cell 200, as discussed above, by selectively turning on and off various ones of the transistor switches 222, 224, 232, 234, 242 and 244. For example, the WS-SRAM cell 200 may be placed in dynamic storage mode by turning off or placing the transistor switches 222, 224 in the OFF condition. The data at a selected one of the first and second load/store inputs 202, 204 may be coupled into the Ws-SRAM cell 200 by turning on both of the transistor switches 242, 244 of the column selector 240 and by turning on or placing a selected one of the first and second transistor switches 232, 234 of the L/S coupler 230 in the ON condition to load the data.

After the data is loaded into a selected one of the first and second inverters 212, 214, according to which of the L/S coupler transistor switches 232, 234 are turned on, the static storage mode, of the WS-SRAM cell 200 may be re-established by placing the pair of transistor switches 222, 224 of the D/S mode selector 220 in the ON condition to store the coupled data. According to some examples, the L/S coupler transistor switches 232, 234 may be turned off at the same time or just prior to the re-establishment of the static storage mode to avoid possible coupled data corruption. In some examples, the column selector switches 242, 244 may also be turned off at the same time or just prior to the re-establishment of the static storage mode.

Further, the respective transistor switch 222, 224 at the output of the master inverter may be turned on prior to turning on the other respective transistor switch 222, 224 at the output of the slave inverter to avoid a potential race condition, according to some examples. For example, if the data was loaded by the first transistor switch 232 of the L/S coupler 230 into the first inverter 212, then the first inverter 212 is the master inverter. In this example, the first transistor switch 222 may be placed in an ON condition first, followed by the second transistor switch 224 to avoid a race condition.

Figure 3B:
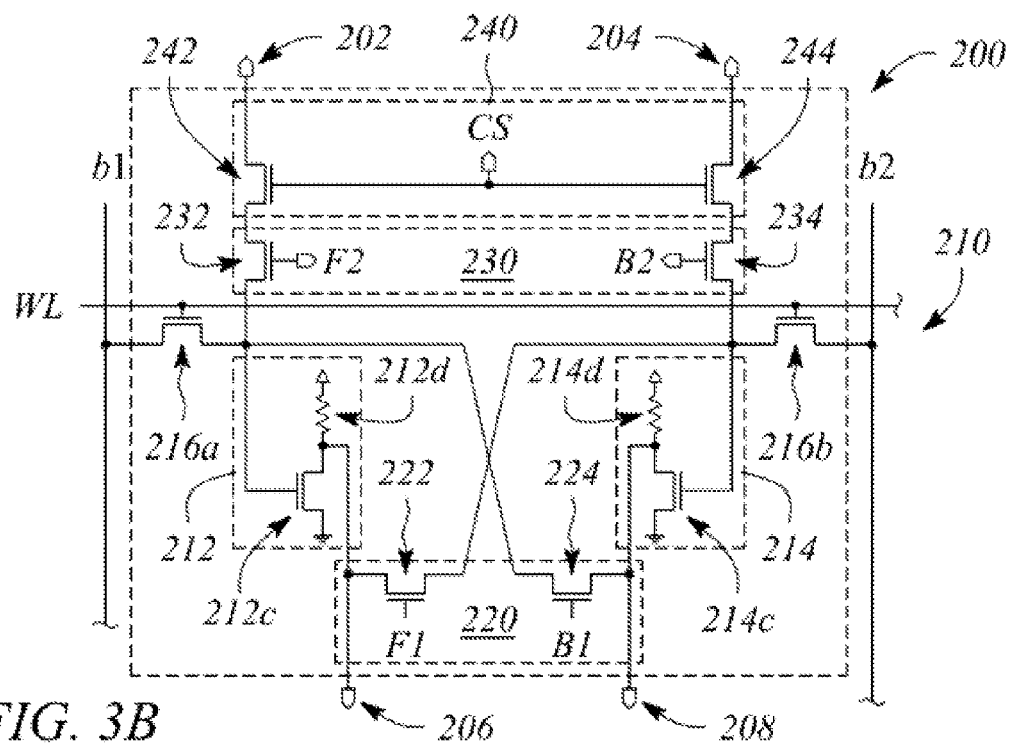
FIG. 3B illustrates a schematic diagram of a WS-SRAM cell, according to another example consistent with the principles described herein.

FIG. 3B illustrates a schematic diagram of a WS-SRAM cell 200, according to another example consistent with the principles described herein. In the example illustrated in FIG. 3B, the SRAM cell 210 is realized as a four-transistor (4T) SRAM cell 210. The 4T SRAM cell 210 is substantially similar to the 6T SRAM cell 210 except that the first and second inverters 212, 214 are each implemented using a single respective transistor 212c, 214c along with a respective bias resistor 212d, 214d, instead of a pair of transistors. The WS-SRAM cell 200 of FIG. 3B also comprises the D/S mode select 220 implemented by the pair of transistor switches 222, 224 (e.g., at ports F1 and B1), the L/S coupler 230 implemented by the pair of transistor switches 232, 234 (e.g., at ports F2 and B2), and the column selector 240 implemented by the pair of transistor switch 242, 244 (e.g., at the common port CS), as illustrated, according to this example.

Table 1 summarizes operation of the WS-SRAM cell 200 in terms of switch states of the various transistor switches 222, 224, 232, 234 identified by their corresponding switch ports (i.e., F1, F2, B1 and B2). In particular, Table 1 includes the switch states of the WS-SRAM cell 200 in both static storage mode and dynamic storage mode. Switch states for an example an upshift as well as a downshift of data in a column of WS-SRAM cells 200 are also provided.

TABLE 1

WS-SRAM storage mode vs. switch states identified by switch ports.

| Storage Mode | F1 | B1 | F2 | B2 | CS |
| --- | --- | --- | --- | --- | --- |
| Static | ON | ON | OFF | OFF | OFF |
| Dynamic - Upshift | OFF | OFF | OFF | ON | ON |
| Dynamic - Downshift | OFF | OFF | ON | OFF | ON |

Other SRAM cell configurations may be substituted for either of the 4T SRAM cell 210 or the 6T SRAM cell 210 illustrated in FIGS. 3A and 3B, according to some examples. For example, the 4T SRAM cell 210 of FIG. 3B may be replaced by a so-called 'loadless' 4T SRAM cell (not illustrated). In other examples, other SRAM cells such as, but not limited to, an eight-transistor (8T) SRAM cell and a ten-transistor (10T) SRAM cell (not illustrated) may be employed in place of the 6T SRAM cell 210, illustrated in FIG. 3A. All such substitutions are within the scope of the principles described herein.

Figure 4A:
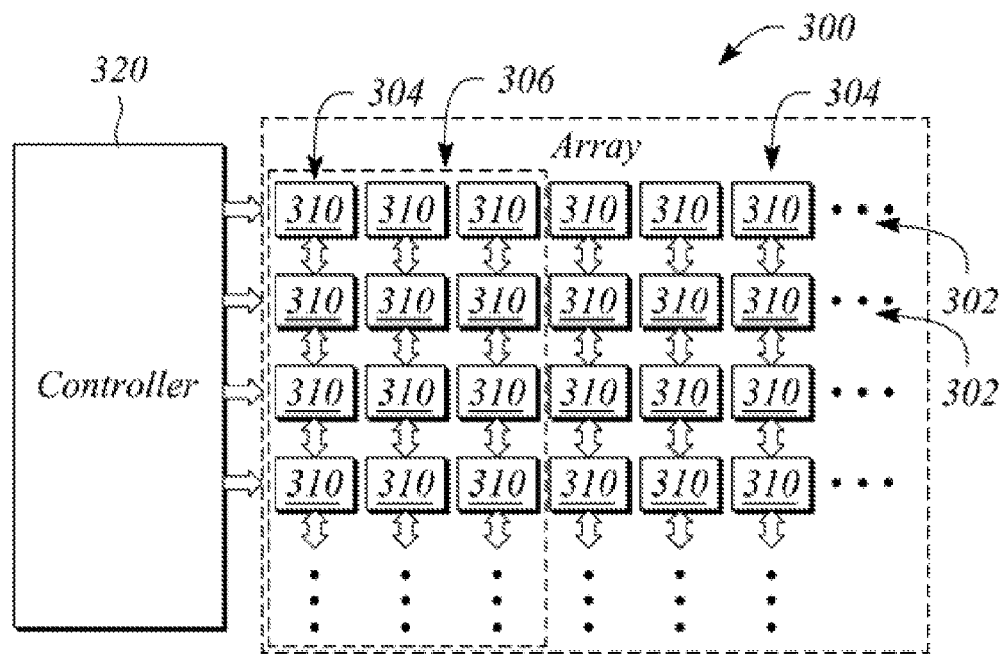
FIG. 4A illustrates a block diagram of word shift static random access memory (WS-SRAM), according to an example consistent with the principles described herein.
Figure 4B:
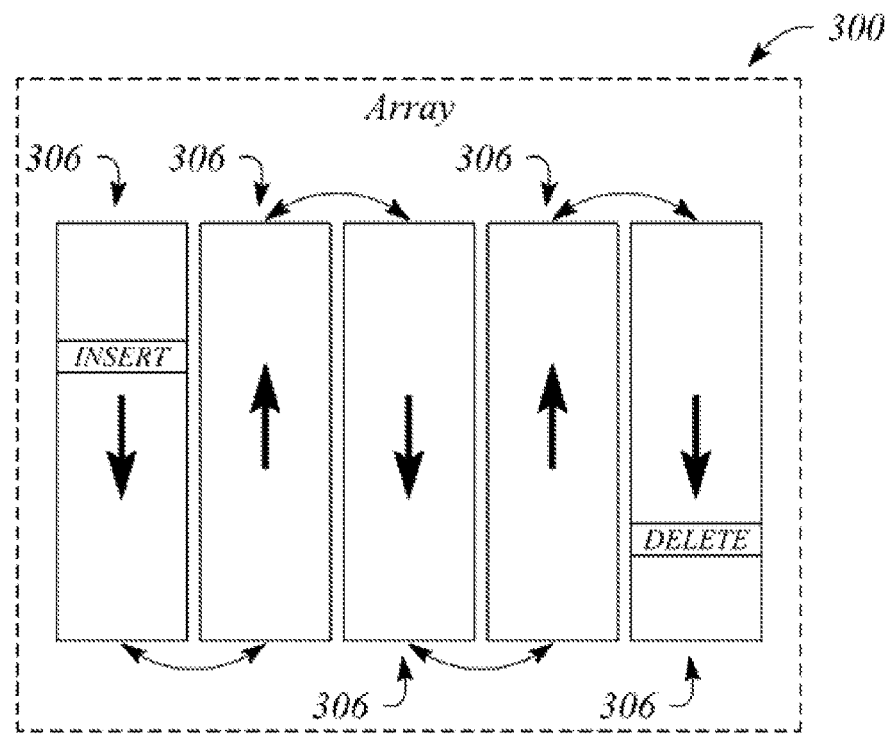
FIG. 4B illustrates another block diagram of the WS-SRAM illustrated in FIG. 4A, according to an example consistent with the principles described herein.

FIG. 4A illustrates a block diagram of word shift static random access memory (WS-SRAM) 300, according to an example consistent with the principles described herein. FIG. 4B illustrates another block diagram of the WS-SRAM 300 illustrated in FIG. 4A, according to an example consistent with the principles described herein. The WS-SRAM 300 comprises a plurality of word shift static random access memory (WS-SRAM) cells 310 arranged in an array having a plurality of rows 302 and a plurality of columns 304. In particular, as illustrated in FIGS. 4A and 4B, the WS-SRAM 300 comprises a plurality of column sub-groups 306, each column subgroup 306 comprising a plurality of columns 304 of WS-SRAM cells 310. A number of the columns 304 in each column subgroup 306 corresponds to a number of bits in a data word. As such, each row 302 in the each column sub-group 306 includes a number of WS-SRAM cells 310 corresponding to the width of a data word. Further, as illustrated by curved arrows in FIG. 4B, adjacent column subgroups 306 are connected one to another in a serpentine connection. Moreover, addresses of data words in adjacent ones of the column subgroups 306 increase in an opposite direction (e.g., top to bottom and then bottom to top) as illustrated by heavy arrows in each of the column subgroups 306, by way of example.

In various examples, the Ws-SRAM cells 310 of the plurality may be substantially similar to the WS-SRAM cell 100 described above. In particular, in some examples, the WS-SRAM cells 310 of the plurality may comprise a dynamic/static (D/S) mode selector that is substantially similar to the D/S mode selector 120 described above. Also the WS-SRAM cell 310 may further comprise a load/store (L/S) coupler that is substantially similar to the L/S coupler 130 described above, according to some examples. And further according to some examples, the WS-SRAM cell 310 may comprise a column selector that is substantially similar to the column selector 140 described above. Moreover, the WS-SRAM cells 310 may be interconnected one to another along columns 304 and within column subgroups 306 in a manner similar to that described above with respect to the WS-SRAM cell 100.

In particular, the D/S mode selector may comprise a decoupling switch between cross-coupled elements of the WS-SRAM cell 310, in some examples. The decoupling switch of the D/S mode selector of the WS-SRAM cell 310 may be configured to provide switching between a dynamic mode and a static storage mode using selectable coupling and decoupling of the cross-coupled elements, for example. The decoupling switch may be substantially similar to the switch, for example the pair of switches 122, 124, described above with respect to the WS-SRAM cell 100, according to various examples.

In some examples, the L/S coupler may comprise a pair of switches to selectively couple data into the WS-SRAM cell 310 from adjacent WS-SRAM cells 310 in a column 304 of the WS-SRAM 300. The pair of switches of L/S coupler of the WS-SRAM cell 310 may be substantially similar to the first and second L/S coupler switches 132, 134 of the L/S coupler 130 described with respect to the WS-SRAM cell 100, according to some examples. Also in some examples, the column selector of the WS-SRAM cell 310 may comprise a pair of switches to selectably determine whether or not the WS-SRAM cell 310 accepts data shifted from adjacent WS-SRAM cells 310 in the column 304. The pair of switches of the column selector of the WS-SRAM cell 310 may be substantially similar to the first and second column selector switches 142, 144 described with respect to the WS-SRAM cell 100, according to some examples.

For example, when the plurality of WS-SRAM cells 310 in a column 304 of the WS-SRAM 300 includes both of a WS-SRAM cell 310 in the first row 302 and an adjacent WS-SRAM cell 310 in a second row 302 above the first row 302, the L/S coupler of the first row WS-SRAM cell 310 may comprise a first L/S coupler switch connected to an output of the adjacent WS-SRAM cell 310 in the second row 302. The first L/S coupler switch may be configured to downshift data in the column 304 from the second row WS-SRAM cell 310 to the first row WS-SRAM cell 310, for example. In an example in which the column 304 further includes another adjacent WS-SRAM cell 310 in a third row 302 below the first row 302, the L/S coupler may comprise a second L/S coupler switch connected to an output of the other adjacent WS-SRAM cell in the third row 302. The second L/S coupler switch may be configured to upshift data in the column 304 from the third row WS-SRAM cell 310 to the first row WS-SRAM cell 310, for example.

Referring again to FIG. 4A, the WS-SRAM 300 further comprises a controller 320. The controller 320 is configured to shift data words between selected adjacent WS-SRAM cells 310 of the array. In particular, the controller 320 is configured to control the shifting of data words one or both of up and down (e.g., as an upshift or as a downshift) in one or more of the column subgroups 306. The data words are shifted by selective activation of the column selector, L/S coupler and the D/S mode selector of WS-SRAM cells 310 by the controller 320, according to various examples. In some examples, the data words are shifted under the control of the controller 320 to selected adjacent WS-SRAM cells 310 that are above a data word location of the data words prior to the shift (e.g., an upshift). In another example, the adjacent WS-SRAM cells 310 that receive the data words are below data word locations of the data words prior to the shift (e.g. a downshift). The heavy arrows within the column subgroups 306 illustrated in FIG. 4B illustrate a downshift by way of example. However, the controller 320 acting in conjunction with the column selectors, the L/S couplers and the D/S mode selectors of the selected WS-SRAM cells 310 may selectably upshift or downshift data between rows and more specifically upshift or downshift data between rows 302 and within column subgroups 306 of the WS-SRAM 300, according to various examples.

It should be noted that, while a particular shift may be considered an upshift or a downshift based on a direction of the movement of the data words relative to data word addresses of the WS-SRAM 300, the shift direction in a particular column 304 or particular column subgroup 306 is not always in a physical direction (e.g., up or down) that correspods with the direction indicated by the shift direction (e.g., upshift or downshift). For example, when the column subgroups 306 are connected in a serpentine connection, addresses of data word locations run from top to bottom in a first (e.g., odd numbered) set of column subgroups 306 and from bottom to top in a second (e.g., even numbered) set of column subgroups 306 that are interspersed with the first set. As such, the physical direction in which data words are shifted is opposite in adjacent column subgroups 306, according to some examples. Referring to FIG. 4B, the example downshift illustrated by the heavy arrows has a downward physical direction in a first column subgroup 306, an upward physical direction in a second adjacent column subgroup 306, and so on. Further, with reference to FIG. 4B, data words that are shifted out of one of the column subgroups 306 (e.g., shift out of either the bottom or the top as indicated by the illustrated curved arrows, are shifted into an adjacent column subgroup 306 by connections that reflect those between WS-SRAM cells 310 of the column subgroup 306. In other words, the serpentine connection of column subgroups 306 of the WS-SRAM 300 may be viewed (and even defined) as a folded single column subgroup that includes substantially all of the WS-SRAM cells 310 in the WS-SRAM 300, according to some examples.

To shift the data words, the controller 320 may provide the control signals F1, B1, F2, B2 and CS (not illustrated in FIGS. 4A and 4B) to the selected WS-SRAM cells 310, as appropriate. In some examples, the control signals F1, B1, F2, and B2 may be provided in common to WS-SRAM cells 310 in a row, on a row-by-row basis. The row-by-row basis facilitates selection of a particular row or rows 302 for participation in a shift. The control signal CS may be provided in common to all of the WS-SRAM cells 310 in a column 304, in some examples. In particular, the control signal CS may be provided in common to all of the WS-SRAM cells 310 in a column subgroup 306 to facilitate selection of the column subgroup 306 and determine whether or not the WS-SRAM cells 310 of the column subgroup 306 accept shifted data words. In some examples, the shifted data words are accepted by being transmitted through the column selectors of respective ones of the WS-SRAM cells 310 that are activated by the common control signal CS.

In some examples, the controller 320 is configured to select a subset of rows of column subgroups in the array. In particular, the controller 320 may be configured to select rows between an INSERT address and a DELETE address when a shift is confined to a single column subgroup 306. In another example, such as when the shift spans a plurality of column subgroups 306, the controller 320 may be configured to select several different sets of rows 302 in sequence. For example, the controller 320 may be configured to initially select a first set of rows 302 from the DELETE address to an end of the column subgroup 306 in a direction (i.e., an address direction) that is toward the INSERT address. The controller 320 then may be configured to cause the data words in the last column subgroup 306 to be shifted. After the words of the last column subgroup 306 are shifted, the controller 320 then may be configured to select all of the rows 302 of any intervening column subgroup 306 between the last column subgroup 306 and a first column subgroup 306 that includes the INSERT address. The controller 320 may be configured to cause the data words in the intervening column subgroups 306 to be shifted. Finally, the controller 320 may be configured to select rows 302 in the first column subgroup 306 between the INSERT address and an end of the first column subgroup 306 in a direction that is toward the DELETE address and to cause the data words in the selected rows 302 to be shifted, completing the shift of all of the data words. The controller 320 may be configured to select the various subset of rows 302 and column subgroups 306 between the INSERT row and the DELETE row by asserting a corresponding set of row control signals (e.g., as control signals F1, B1, F2, and B2) and column select signals (e.g., as column select signal CS), for example. The row control signals asserted by the controller 320 may be communicated to the rows by row control lines (not illustrated), according to some examples. Similarly, the column select signals may be communicated to the columns 304 by column control lines (not illustrated), according to some examples.

According to some examples, the controller 320 is further configured to shift data between WS-SRAM cells 310 only within the selected subset of rows 302 and columns 304. In some examples, the shifted data words may represent a contiguous subset of the data stored in the WS-SRAM 300, for example. According to some examples, the contiguous subset of data has a size (e.g., number of data words) that is smaller than a total storage size of the WS-SRAM 300.

Further, the data shifting provided by the controller 320 of the WS-SRAM 300 only shifts data words stored inside the contiguous subset when the contiguous subset is shifted by or under the control of the controller 320, according to various examples.

Figure 5:
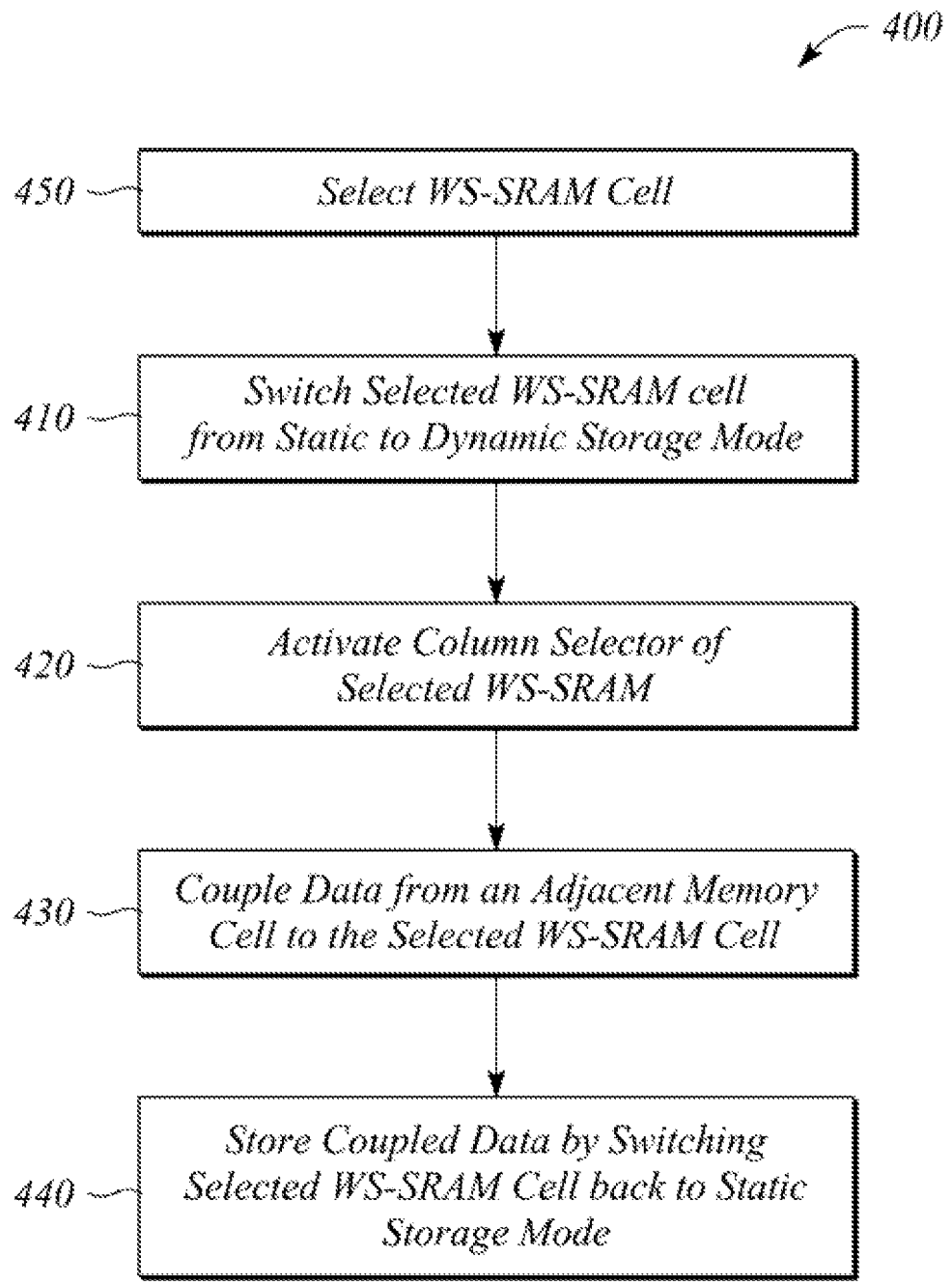
FIG. 5 illustrates a flow chart of method of shifting data using a word shift static random access memory (WS-SRAM), according to an example in accordance with the principles described herein.

FIG. 5 illustrates a flow chart of a method 400 of shifting data using a word shift static random access memory (WS-SRAM), according to an example consistent with the principles described herein. As illustrated, the method 400 of shifting data comprises switching 410 a selected WS-SRAM cell in a row of the WS-SRAM from a static storage mode to a dynamic storage mode. The WS-SRAM cell may be substantially similar to the WS-SRAM cell 100 described above, according to some examples.

In particular, switching 410 the selected WS-SRAM cell may be provided by decoupling cross-coupled elements of the WS-SRAM cell, according to various examples. For example, the cross-coupled elements of the WS-SRAM cell are decoupled by opening one or more switches located in a cross-coupling connection between the cross-coupled elements. Opening the switches breaks the connection and isolates the cross-coupled elements from one another to produce the dynamic storage mode. In some examples, the switches may be opened in a substantially simultaneous manner.

The switches may be provided by a dynamic/static (D/S) mode selector, for example. According to some examples, the D/S mode selector may be substantially similar to the S/D mode selector 120 described above with respect to the WS-SRAM cell 100. In some examples, the cross coupled elements may be substantially similar to the pair of cross-coupled elements 112, 114 described above with respect to the WS-SRAM cell 100. For example, the cross-coupled elements may comprise a pair of inverters and the D/S mode selector may comprise a pair of transistor switches.

The method 400 of shifting data further comprises activating 420 a column selector of the selected WS-SRAM cell. The column selector may be activated using a column select signal. The column select signal may be common to a plurality of WS-SRAM cell in a column and more specifically in a column subgroup, in some examples. According to some examples, the column selector may be substantially similar to the column selector 140 described above with respect to the WS-SRAM cell 100. In particular, the column selector may comprise a pair of switches that are substantially similar to the pair of column selector switches 142, 144.

The method 400 of shifting data further comprises coupling 430 data from an adjacent memory cell to the selected WS-SRAM cell. According to various examples, the adjacent memory cell may be in another row of the WS-SRAM from the row of the selected WS-SRAM cell. In some examples, the selected WS-SRAM cell is in a column of the WS-SRAM. In some examples, the column is a member of a column subgroup. The adjacent memory cell may be another WS-SRAM cell in the same column, for example. Coupling 430 the data from the adjacent memory cell into the selected WS-SRAM cell is configured to load the data into the selected WS-SRAM cell. In particular, the data is loaded into a master element of the cross-coupled elements of the selected WS-SRAM cell.

In some examples, coupling 430 the data from the adjacent memory cell comprises employing a load/shift (L/S) coupler. The L/S coupler may connect an input of the selected WS-SRAM cell to an output of the adjacent memory cell, for example. The coupled data may be transmitted through the L/S coupler, for example. In some examples, the L/S coupler may be connected in series with the column selector and the data may be transmitted through both of the L/S coupler and the activated column selector. In some examples, the L/S coupler may be substantially similar to the L/S coupler 130 described above with respect to the WS-SRAM cell 100. In particular, the L/S coupler may comprise a switch (e.g., a transistor switch) that, when activated, facilitates transmission of the data through the L/S coupler, for example.

The method 400 of shifting data further comprises storing 440 the coupled data by switching the selected WS-SRAM cell back to the static storage mode. The selected WS-SRAM cell may be switched back to the static storage mode by the D/S mode selector, for example. In some examples, a first switch (e.g., of the D/S mode selector) is closed first; i.e., the switch connected between an output of the coupled element receiving the coupled data from the adjacent memory cell and an input of the other coupled element. After the first switch is closed, a second switch connected between an output of the other coupled element and the receiving coupled element is closed. Sequentially closing the first switch and then the second switch may avoid development of a race condition in the cross-coupled elements once coupling is re-established by closing the switches, for example.

In some examples, the method 400 of shifting data further comprises selecting 450 the WS-SRAM cell. In some examples, selecting 450 the WS-SRAM cell comprises providing an INSERT address and a DELETE address. In these examples, switching 410 the selected WS-SRAM cell(s), activating 420 the column selector, coupling 430 the data from an adjacent memory cell, and storing 440 the coupled data are performed on each of a plurality of WS-SRAM cells in rows of a column subgroup between the INSERT address and the DELETE address. Selecting 450 the WS-SRAM cell may be provided by asserting a column select signal to activate 420 the column selector, in some examples. The column select signal may be common to WS-SRAM cells in the column subgroup, for example. Selecting 450 the WS-SRAM cell, switching 410 the selected WS-SRAM cell(s), coupling 420 the data, and storing 430 the coupled data collectively result in a word shift of the data stored in the WS-SRAM rows of the column subgroup(s) between the INSERT address and the DELETE address, according to several examples. For example, coupling 430 data and storing 440 the coupled data may be performed on the selected WS-SRAM cells resulting in a word shift of the data stored in the WS-SRAM cells between the INSERT address and the DELETE address, in some examples.

Thus, there have been described examples of a word shift static random access memory (WS-SRAM) cell, a word shift static random access memory (WS-SRAM), and method of shifting data using the WS-SRAM that each employs switching between a dynamic storage mode and a static storage mode to shift data. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A word shift static random access memory (WS-SRAM) cell comprising:
a static random access memory (SRAM) cell having a pair of cross-coupled elements to store data;
a dynamic/static (D/S) mode selector to selectably switch the WS-SRAM cell between a dynamic storage mode and a static storage mode, the D/S mode selector comprising a switch to selectably couple and decouple the pair of cross-coupled elements of the SRAM cell;
and a column selector to selectably determine whether or not the WS-SRAM cell accepts data shifted from an adjacent memory cell during the dynamic storage mode, wherein the dynamic storage mode corresponds to decoupled cross-coupled elements and the static storage mode corresponds to coupled cross-coupled elements;
a load/store (L/S) coupler to selectably couple data from the adjacent memory cell into the WS-SRAM cell in conjunction with the column selector:
wherein the D/SRAM cell is put into the dynamic storage mode and selectably coupled to the adjacent memory cell by activating the load/store coupler;
wherein in response to activating the load/store coupler, the data is transferred from the adjacent memory cell into one of the cross-coupled elements of the memory cell, and the load/store coupler is deactivated and the memory cell is put into the static memory mode to retain the loaded data.

2. The WS-SRAM cell of claim 1, wherein the cross-coupled elements comprise a first inverter cross-coupled to a second inverter, and wherein the switch comprises a first transistor switch connected between an output of the first inverter and an input of the second inverter, and a second transistor switch connected between an output of the second inverter and an input of the first inverter, and wherein the dynamic storage mode is provided by an OFF condition of both of the first transistor switch and the second transistor switch to decouple the cross-coupled first and second inverters.

3. The WS-SRAM cell of claim 1, wherein the SRAM cell is a six transistor (6T) SRAM cell.

4. The WS-SRAM cell of claim 1, wherein the L/S coupler comprises: a first L/S coupler switch connected between a first load/store input of the WS-SRAM cell and a first cross-coupled element of the pair to selectably couple data from a first adjacent memory cell; and a second L/S coupler switch connected between a second load/store input of the WS-SRAM cell and a second cross-coupled element of the pair to selectably couple data from a second adjacent memory cell, and wherein the column selector comprises a first column selector switch connected in series with the first L/S coupler switch, and a second column selector switch connected in series with the second L/S coupler switch, the first and second column selector switches to selectably couple data into the WS-SRAM cell in conjunction with the L/S coupler.

5. A word shift static random access memory (WS-SRAM) comprising the WS-SRAM cell of claim 1 arranged in a column that includes a plurality of other memory cells, the WS-SRAM further comprising a controller to shift data from the adjacent memory cell in the column to the WS-SRAM cell by selective activation of the column selector, the L/S coupler and the D/S mode selector, wherein the selective activation to provide a downshift of the data when the adjacent memory cell is in the column at a location above the WS-SRAM cell and to provide an upshift of the data when the adjacent memory cell is in the column at a location below the WS-SRAM cell, and wherein the column is connected to adjacent columns to transfer data in a serpentine manner along the columns during the downshift of the data and the upshift of the data.

6. A word shift static random access memory (WS-SRAM) comprising:
   a plurality of WS-SRAM cells arranged in an array having rows and columns, each of the WS-SRAM cells comprising a dynamic/static (D/S) mode selector, a column selector and a load/store (L/S) coupler;
   a controller to shift data words between selected adjacent WS-SRAM cells of the array by selective activation of the column selector, L/S coupler and the D/S mode selector, wherein the D/S mode selector comprises a decoupling switch between cross-coupled elements of the WS-SRAM cell to provide switching between a dynamic storage mode and a static storage mode, and. wherein columns in one or more column subgroups selected by the column selector are connected in a serpentine connection of column subgroups;
   a plurality of row control signals and a plurality of column select signals to select a subset of WS-SRAM cells in selected columns, and wherein the controller is further configured to:
   activate the D/S mode selector of the subset of WS-SRAM cells to switch the subset of WS-SRAM cells from the static storage mode to the dynamic storage mode;
   selectively activate both the column selector and the L/S coupler of the subset of WS-SRAM cells to load data into WS-SRAM cells of a row from the adjacent WS-SRAM cells in another row;
   and deactivate the L/S coupler and D/S mode selector of the subset of WS-SRAM cells to store the loaded data by returning the subset of WS-SRAM cells to static storage mode.

7. The WS-SRAM of claim 6, wherein the adjacent WS-SRAM cells comprise a first WS-SRAM cell in a first row of a column, a second WS-SRAM cell in a second row of the column, and a third WS-SRAM cell in a third row of the column, the second row being above the first row and the third row being below the first row, and wherein the L/S coupler of the first WS-SRAM cell comprises: a first L/S coupler switch connected to an output of the second WS-SRAM cell in the second row, the first L/S coupler switch to downshift data in the column from the second WS-SRAM cell to the first WS-SRAM cell; and a second L/S coupler switch connected to an output of the third WS-SRAM cell in the third row, the second L/S coupler switch to upshift data in the column from the third WS-SRAM cell to the first WS-SRAM cell, and wherein the column selector comprises a first column selector switch connected in series with the first L/S coupler switch and a second column selector switch connected in series with the second L/S coupler switch, the first and second column selector switches to couple data into the first WS-SRAM cell according to a common column select activation signal.

8. The WS-SRAM of claim 6, wherein the WS-SRAM cells further comprise a six transistor (6T) SRAM cell, the cross-coupled elements comprising a pair of cross-coupled inverters implemented by four transistors of the 6T SRAM cell, and wherein the D/S mode selector comprises a pair of transistors in cross-coupling connections between the pair of cross-coupled inverters, the decoupling switch to use the pair of transistors to selectably disconnect and selectably connect the cross-coupling connections.

9. The WS-SRAM of claim 6, wherein the controller is configured to select the subset of the WS-SRAM cells in the array between an INSERT address and a DELETE address, the INSERT address being in a first column subgroup and the DELETE address being in a last column subgroup of a plurality of serpentine-connected column subgroups of the array, and wherein the controller is further configured to shift data words between the WS-SRAM cells only within the selected subset of WS-SRAM cells along the serpentine-connected column subgroups, the shifted data words of the selected subset of WS-SRAM cells representing a contiguous subset of the data stored in the WS-SRAM, wherein the contiguous subset of the data has a size that is smaller than a total storage size of the WS-SRAM, and wherein the controller only shifts data stored inside the contiguous subset when the contiguous subset is shifted in a direction from the INSERT address toward the DELETE address.

10. A method of shifting data using a word shift static random access memory (WS-SRAM), the method comprising:
   switching a selected WS-SRAM cell in m the WS-SRAM from a static storage mode to a dynamic storage mode by decoupling cross-coupled elements of the WS-SRAM cell;
   in response to switching the selected WS-SRAM cell to the dynamic storage mode, activating a column selector of the selected WS-SRAM cell using a column select signal;
   in response to activating the column selector, coupling data from an adjacent memory cell in another row of the WS-SRAM into the selected WS-SRAM cell to load the data;
   and in response to the data being loaded in the selected WS-SRAM cell, storing the coupled data by switching the selected WS-SRAM cell hack to the static storage mode.

11. A method of shifting data of claim 10, wherein switching the selected WS-SRAM cell comprises opening switches of a dynamic/static (D/S) mode selector in a cross-coupling connection between the cross-coupled elements to decouple the cross-coupled elements, and wherein coupling data comprises employing a combination of the activated column selector and a load/shift (L/S) coupler to connect an input of the selected WS-SRAM cell to an output of the adjacent memory cell, the coupled data being transmitted through the column selector and the L/S coupler, the selected WS-SRAM cell being a member of a column subgroup of the WS-SRAM.

12. The method of shifting data of claim 10, further comprising selecting a plurality of WS-SRAM cells in a plurality of rows and columns, wherein selecting the plurality of WS-SRAM cells comprises: providing an INSERT address and a DELETE address; selecting the WS-SRAM cells in rows of a column subgroup between the INSERT address and the DELETE address by asserting a column select signal to activate the column selector, the column select signal being common to the selected WS-SRAM cells in the column subgroup, wherein coupling data and storing the coupled data are performed on the selected WS-SRAM cells in the rows resulting in a word shift of the data stored in the WS-SRAM cells between the INSERT address and the DELETE address.

13. The method of shifting data of claim 12, wherein the column subgroup is a member of a plurality of column subgroups connected in a serpentine connection, the INSERT address being in a first column subgroup and the DELETE address being in a last column subgroup of the plurality, the method of shifting further comprising: performing the word shift of stored data in the last column subgroup to shift data from an end of the last column subgroup toward the DELETE address, the end of the last column subgroup being in a direction along the serpentine connection that is toward the INSERT address; performing the word shift of stored data in any column subgroup between the first column subgroup and the last column subgroup; and performing the word shift of stored data in the first column subgroup to shift data from the INSERT address toward an end of the first column subgroup, the end of the first column subgroup being in a direction along the serpentine connection that is toward the DELETE address.

* * * * *